US008829493B2

(12) United States Patent
Schmid et al.

(10) Patent No.: US 8,829,493 B2
(45) Date of Patent: Sep. 9, 2014

(54) ELECTRICAL ORGANIC COMPONENT POLYMERIC RHENIUM COMPOUNDS AND A METHOD FOR ITS PRODUCTION

(75) Inventors: Guenter Schmid, Hemhofen (DE);
Britta Goeoetz, Regensburg (DE);
Karsten Heuser, Erlangen (DE);
Wolfgang Scherer, Leitershofen (DE);
Rudolf Herrmann, Augsburg (DE);
Ernst-Wilhelm Scheidt, Diedorf/Bjburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 807 days.

(21) Appl. No.: 12/596,208

(22) PCT Filed: Apr. 3, 2008

(86) PCT No.: PCT/DE2008/000571
§ 371 (c)(1),
(2), (4) Date: Mar. 11, 2010

(87) PCT Pub. No.: WO2008/128503
PCT Pub. Date: Oct. 30, 2008

(65) Prior Publication Data
US 2010/0207104 A1 Aug. 19, 2010

(30) Foreign Application Priority Data

Apr. 23, 2007 (DE) .......................... 10 2007 019 081
May 24, 2007 (DE) .......................... 10 2007 024 153

(51) Int. Cl.
*H01L 51/54* (2006.01)
*H01L 51/56* (2006.01)
*H01L 51/52* (2006.01)
*H01L 51/50* (2006.01)
*H01L 51/00* (2006.01)

(52) U.S. Cl.
CPC ........ *H01L 51/0021* (2013.01); *H01L 51/5234* (2013.01); *H01L 51/5052* (2013.01); *H01L 51/5206* (2013.01); *Y02E 10/549* (2013.01); *Y10S 428/917* (2013.01)
USPC ...... 257/40; 428/690; 428/917; 257/E51.001; 438/99

(58) Field of Classification Search
None
See application file for complete search history.

(56) References Cited

U.S. PATENT DOCUMENTS

| 5,409,783 | A | 4/1995 | Tang et al. |
| 5,457,357 | A | 10/1995 | Fujii et al. |
| 6,214,151 | B1 | 4/2001 | Chen et al. |
| 6,416,888 | B1 | 7/2002 | Kawamura et al. |
| 6,586,119 | B1 | 7/2003 | Hashimoto et al. |
| 7,153,592 | B2 | 12/2006 | Yoshikawa |
| 7,183,707 | B2 | 2/2007 | Tyan et al. |
| 8,330,148 | B2 * | 12/2012 | Schmid et al. .................. 257/40 |
| 2002/0051894 | A1 | 5/2002 | Yoshikawa |
| 2002/0197415 | A1 | 12/2002 | Bravo Vasquez et al. |
| 2005/0014026 | A1 | 1/2005 | Park |
| 2005/0025993 | A1 * | 2/2005 | Thompson et al. ........... 428/690 |
| 2006/0008745 | A1 | 1/2006 | Sasaki et al. |
| 2006/0060834 | A1 | 3/2006 | Hirai |
| 2006/0061270 | A1 | 3/2006 | Uhlig et al. |
| 2006/0076537 | A1 | 4/2006 | Christou et al. |
| 2006/0119258 | A1 * | 6/2006 | Sakata et al. ................... 313/504 |
| 2006/0147750 | A1 * | 7/2006 | Ujiie et al. ..................... 428/690 |
| 2006/0159954 | A1 | 7/2006 | Haga et al. |
| 2006/0182994 | A1 | 8/2006 | Sakamoto et al. |
| 2006/0186804 | A1 | 8/2006 | Sakakura et al. |
| 2006/0237731 | A1 | 10/2006 | Furukawa et al. |
| 2006/0238113 | A1 | 10/2006 | Kashiwabara et al. |
| 2006/0273303 | A1 | 12/2006 | Wu et al. |
| 2007/0087223 | A1 | 4/2007 | Sakamoto et al. |
| 2007/0170843 | A1 | 7/2007 | Kawamura et al. |
| 2007/0182317 | A1 | 8/2007 | Kido et al. |
| 2008/0032441 | A1 | 2/2008 | Hirai |
| 2008/0191611 | A1 | 8/2008 | Iwaki et al. |
| 2009/0058267 | A1 | 3/2009 | Nakashima et al. |
| 2009/0091246 | A1 * | 4/2009 | Tsuji et al. ..................... 313/504 |
| 2009/0215354 | A1 | 8/2009 | Maeda et al. |

FOREIGN PATENT DOCUMENTS

| DE | 43 18 310 A1 | 12/1993 |
| EP | 0 669 387 B1 | 8/1995 |
| EP | 0 880 304 A2 | 11/1998 |
| EP | 1 083 776 A1 | 3/2001 |
| EP | 1 548 840 A1 | 6/2005 |
| EP | 1 638 155 A1 | 3/2006 |
| EP | 1 662 844 A1 | 5/2006 |
| EP | 1 732 150 A1 | 12/2006 |
| GB | 1 593 898 | 7/1981 |
| JP | 2000235893 A | 8/2000 |
| JP | 2005521211 A | 7/2005 |
| JP | 2006164708 A | 6/2006 |
| JP | 2006269329 A | 10/2006 |

(Continued)

OTHER PUBLICATIONS

Miller et al. "Design of the electronic structure of poly-MTO" Symposium Organic Optoelectronics and Photonics 2005, SYOO 6.62 Mo 18:00 Poster TU A pp. 1-4. Year of publication: 2005.*

(Continued)

*Primary Examiner* — Andrew K Bohaty
(74) *Attorney, Agent, or Firm* — Slater & Matsil, L.L.P.

(57) ABSTRACT

An electrical organic component includes a first electrode, an organic functional layer on the first electrode and a second electrode on the organic functional layer. The first and/or second electrodes contain rhenium compounds.

29 Claims, 1 Drawing Sheet

(56) References Cited

FOREIGN PATENT DOCUMENTS

| JP | 2009218568 A | 9/2009 |
|---|---|---|
| TW | 200531589 | 9/2005 |
| TW | 200637821 | 11/2006 |
| TW | I271119 B | 1/2007 |
| WO | WO 03/069959 A1 | 8/2003 |
| WO | WO 2005/101540 A2 | 10/2005 |
| WO | WO 2006/059745 A1 | 6/2006 |
| WO | WO 2006/101016 A1 | 9/2006 |
| WO | WO 2006121105 A1 * | 11/2006 |

OTHER PUBLICATIONS

Zhou, X., et al., "Enhanded Hole Injection into Amorphous Hole-Transport Layers of Organic Light-Emitting Diodes Using Controlled p-Type Doping", Advanced Functional Materials, 2001, pp. 310-314, vol. 11, No. 4.

Endo, J., et al., "Organic Electroluminescent Devices with a Vacuum-Deposited Lewis-Acid-Doped Hole-Injection Layer", Applied Physics Letters, Mar. 15, 2002, pp. L358-L360, vol. 41, part 2 No. 3B, The Japan Society of Applied Physics.

Zhou, X., et al., "Low-Voltage Inverted Transparent Vacuum Deposited Organic Light-Emitting Diodes Using Electrical Doping", Applied Physics Letters, Jul. 29, 2002, pp. 922-924, vol. 81, No. 5.

Zhou, X., et al., "High-Efficiency Electrophosphorescent Organic Light-Emitting Diodes with Double Light-Emitting Layers", Applied Physics Letters, Nov. 18, 2002, pp. 4070-4072, vol. 81, No. 21.

Kurata, T., et al., "Charge-Transporting Property of Polymer Films Doped with Organic Stable Radicals", Journal of Photopolymer Science and Technology, Apr. 1, 2003, pp. 297-298, vol. 16, No. 2.

Gao, W., et al., "Controlled p Doping of the Hole-Transport Molecular Material N,N' - diphenyl - N,N' - bis(1-naphthyl) - 1,1' - biphenyl - 4,4' - diamine with tetrafluorotetracyanoquinodimethane", Journal of Applied Physics, Jul. 1, 2003, pp. 359-366, vol. 94, No. 1.

He, G., et al., "High-Efficiency and Low-Voltage p-i-n Electrophosphorescent Organic Light-Emitting Diodes with Double-Emission Layers", Applied Physics Letters, Oct. 25, 2004, pp. 3911-3913, vol. 85, No. 17.

He, G., et al., "Very High-Efficiency and Low-Voltage Phosphorescent Organic Light-Emitting Diodes Based on a p-i-n Junction", Applied Physics Letters, 2004, pp. 5773-5777.

Miller, R., et al., "Design of the Electronic Structure of poly-MTO", Physica B, 2005, pp. 359-361, Elsevier.

Harada, K., et al., "Organic Homojunction Diodes with a High Built-in Potential: Interpretation of the Current-Voltage Characteristics by a Generalized Einstein Relation", Physical Review Letters, Jan. 28, 2005, pp. 036601-1-036601-4, vol. 94, The American Physical Society.

Miller, R., et al., "poly-methyltrioxorhenium $\{(CH_3)_{0.92}ReO_3\}_\infty$, A Conducting Two-Dimensional Organometallic Oxide", Physical Review B, 2006, pp. 165113-1-165113-14, vol. 73, No. 16, The American Physical Society.

Scheidt, E., W., et al., "Possible Localization Behavior of the Inherent Conducting Polymer $(CH_3)_{0.92}ReO_3$", Physica B, 2006, pp. 378-380, Elsevier.

Miller. R., et al., "Poly-MTO, $\{(CH_3)_{0.92}ReO_3\}_\infty$, a Conducting Two-Dimensional Organometallic Oxide", Physical Review B, 2006.

Feng, L., et al., "Synthesis and photoluminescent properties of some novel fluorene derivatives," Dyes and Pigments, Jan. 2005, pp. 31-34, vol. 64, Issue 1, Elsevier.

* cited by examiner

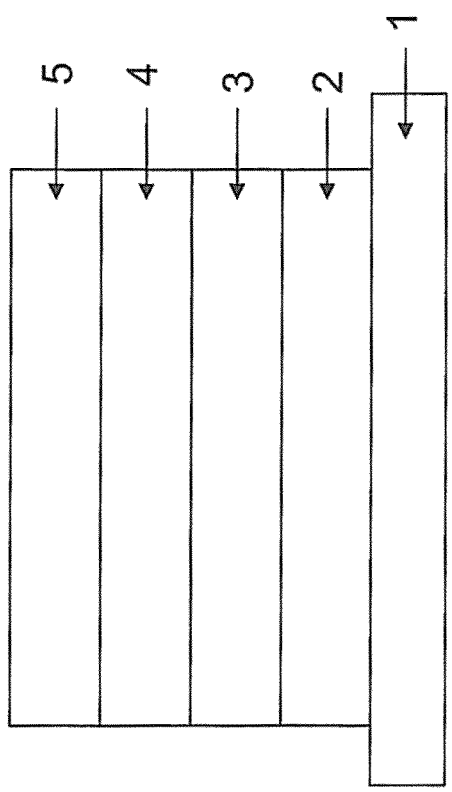

ELECTRICAL ORGANIC COMPONENT POLYMERIC RHENIUM COMPOUNDS AND A METHOD FOR ITS PRODUCTION

This patent application is a national phase filing under section 371 of PCT/DE2008/000571, filed Apr. 3, 2008, which claims the priority of German patent applications 10 2007 019 081.8, filed Apr. 23, 2007 and 10 2007 024 153.6 filed May 24, 2007, each of which is incorporated herein by reference in its entirety.

TECHNICAL FIELD

The invention deals with an electrical organic component with a substrate, a first electrode, an organic functional layer on the first electrode and a second electrode on the organic functional layer.

BACKGROUND

Electrical organic components with organic functional layers, for example, organic light emitting diodes (OLEDs), organic solar cells or organic photodetectors, have an efficiency and lifetime that are dependent, among other things, on how well charge carrier injection from the electrodes into the organic functional layer or from the functional layer to the electrodes takes place.

SUMMARY

In one aspect the invention provides an electrical organic component with improved electrode materials that enables improved charge carrier transport between the electrode and an organic functional layer.

In an electrical organic component in accordance with one embodiment of the invention the first and/or second electrode contain rhenium compounds. Such an electrical organic component comprises a substrate, a first electrode, an organic functional layer on the first electrode and a second electrode on the organic functional layer.

Because the first and/or second electrode contain rhenium compounds, charge carrier transport between the organic functional layer of the electrical organic component and the electrode is facilitated giving rise to an improvement in the efficiency and lifetime of the component.

The term "on" with respect to the sequence of layers in the electrical organic components means that, for example, the organic functional layer can be in direct contact with the first electrode, but also that additional layers can be present between the first electrode and the organic functional layer.

The rhenium compounds can in addition comprise rhenium oxo compounds, for example, rhenium oxides.

According to a further embodiment of the invention the first and/or second electrode is transparent. In this way, in each case according to the use of the component, visible light, for example, can be emitted through the electrodes or light can be coupled through the electrodes into the organic functional layer.

According to another embodiment the first and/or second electrode comprises polymeric rhenium compounds. Further, the polymeric rhenium compounds can comprise organometallic rhenium oxides or organic rhenium oxo compounds. The polymeric rhenium oxides are, for example, selected from the group comprising polyalkyltrioxorhenium, substituted or unsubstituted polycyclopentadienyltrioxorhenium and polytrioxorhenium with at least one aromatic substituent. The polymeric rhenium compound can be poly-methyltrioxorhenium (poly-MTO). The compounds are easily obtained by polymerization and are characterized by being stable. In addition, they offer an alternative to the materials that are traditionally used for electrodes.

Further, the polymeric rhenium compounds can comprise dopants. The dopants may increase the characteristic conductivity of the rhenium compounds and, for example, can be chosen from the group comprising tetrathiafulvalene (TTF), bis(ethylenedithio)tetrathiafulvalene (BEDT-TTF), $SbF_3$, V, Mo and W. Doping the rhenium compounds improves additionally the charge transport between the electrode and the organic functional layer, for example, charge carrier injection from the electrode into the organic functional layer.

In a further embodiment a doped electrically semiconducting layer is present between the organic functional layer and the first and/or the second electrode. The doped electrically semiconducting layer may contain a dopant, the dopant comprising rhenium compounds, for example, rhenium-oxocompounds.

In a further embodiment the dopant is an $ReO_3$ unit to which a residue M, which can be organic, is bound. The $ReO_3$ unit exhibits a low oxidation power, so that it is stable in combination with organic residues. The residue M can be σ-bonded to the $ReO_3$ unit. Because of the extraordinary redox stability of the $ReO_3$ unit an organometallic compound with a σ-bonded organic residue is stable. Further, the $ReO_3$ unit to which an organic residue M is bound is suitable for the doping activity, since it has a special Lewis acidic character.

The residue M can be selected from a group comprising branched and unbranched saturated aliphatic groups, branched and unbranched unsaturated aliphatic groups, aromatic groups, anions of carboxylic acids, halogens, stanyl residues and silyl residues. The saturated aliphatic groups can be, for example, methyl, ethyl and propyl groups, but also substituted aliphatic substituents such as, for example, benzyl or fluoroaliphatic groups. Examples of aromatic substituents may be phenyl, indenyl and mesityl. Acetate, trifluoroacetate and toluenesulfonate are examples of anions of carboxylic acids or organic acids. Trimethylsilyl, for example, can be used as a silyl residue, and chlorine, bromine and iodine residues can be used as halogens. These residues M may form a stable σ bond with the $ReO_3$ unit. In addition, the aliphatic groups, the aromatic substituents and the anions of carboxylic acids can have additional substituents. Advantageously these are donor substituents, for example, amines, phosphanes or thiols. These substituents may increase the p-doping effect of the dopant.

In a further embodiment the residue M can be π-bonded to the $ReO_3$ unit. Further, the residue M can comprise unsubstituted or substituted cyclopentadienyl with the structural formula $(C_5R_xH_{5-x})$, wherein x is 1 to 5; R may comprise substituents that, independent of one another, comprise an alkyl residue, for example, methyl or ethyl, or an aryl residue, for example, a phenyl residue. The rhenium oxides with π-bonded organic residues M also form stable compounds and are Lewis acidic.

According to a further embodiment of the invention, the electrically semiconducting layer comprises a matrix material in which rhenium compounds are present as dopants. Furthermore, the matrix material may be p-doped by the dopant. In this way a positive charge or partial charge is generated in the matrix material at the energy level that mediates charge carrier transport. In this case for p-doping the lowest unoccupied orbital (LUMO) of the dopant can be energetically localized near or even below the highest occupied orbital (HOMO) of the matrix material, with the result that an electron is transferred from the HOMO of the matrix material to the LUMO of the dopant and thus a positive charge or partial charge is generated in the matrix material.

According to a further embodiment, the matrix material is a hole-transporting, or defect electron-transporting material, which can, for example, contain nitrogen, oxygen, sulfur, selenium, phosphorus and arsenic groups as well as any combinations thereof, the groups being able to readily transfer electrons, or negative partial charges, to a p-dopant.

Furthermore, the material of the matrix can be selected from a group that comprises phenanthroline derivatives, imidazole derivatives, triazole derivatives, oxadiazole derivatives, phenyl-containing compounds, compounds with condensed aromatic substituents, carbazole-containing compounds, fluorene derivatives, spirofluorene derivatives and pyridine-containing compounds as well as any combinations of the materials. Examples of structural formulas of matrix materials based on triarylamines and carbazoyl compounds are:

N,N'-diphenyl-N,N'-(3-methylphenyl-1,1'-biphenyl-4,4'-diamine (TPD, Formula 1);
4,4',4-tris(N-3-methylphenyl-N-phenylamino)-triphenylamine (m-MTDATA, Formula 2);
2,9-dimethyl-4,7-diphenyl-1,10-phenanthroline (BCP, Formula 3);
4,4',4-tris(N-1-naphthyl-N-phenylamino)triphenylamine (1-TNATA, Formula 4);
2,2',7,7'-tetrakis(diphenylamine-9,9'-spirobifluorene (Spiro-TAD, Formula 5);
4,4'-N,N'-dicarbazolebiphenyl (CBP, Formula 6);
(N,N'-bis(naphthalene-1-yl-N,N'-bis(phenyl)benzidine) (α-NPD, Formula 7)

Formula 1

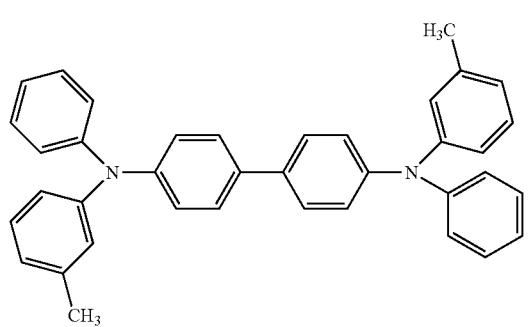

Formula 2

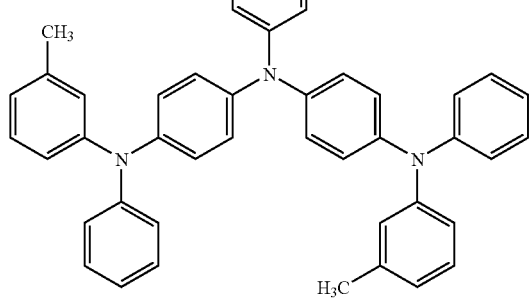

Formula 3

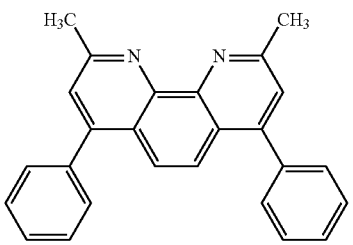

Formula 4

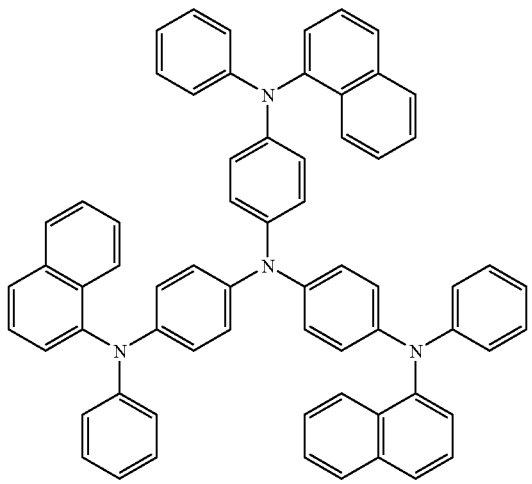

Formula 5

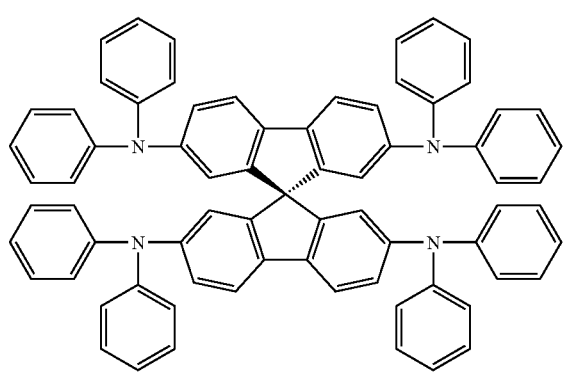

Formula 6

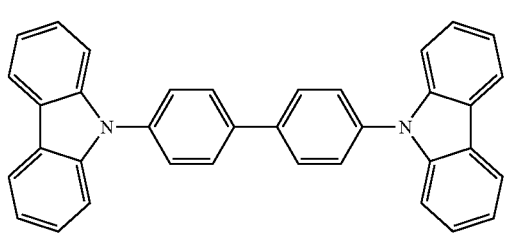

CBP

Formula 7

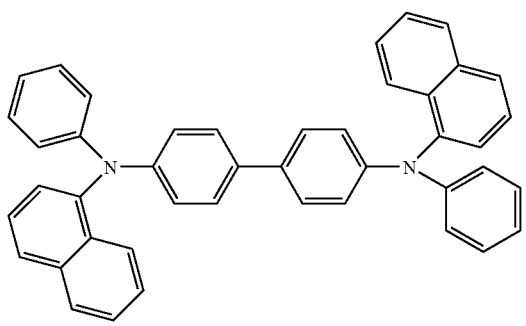

An example of phenanthroline derivatives is 4,7-diphenyl-1,10-phenanthroline (BPhen), an example of imidazole derivatives is 1,3,5-tris-(1-phenyl-1H-benzimidazol-2-yl)-benzene (TPBi), and an example of triazole derivatives 3-phenyl-4-(1'-naphthyl)-5-phenyl-1,2,4-triazole (TAZ). ((2,4-Biphenylyl)-5-(4-tert-butylphenyl)-1,3,4-oxadiazole) (Bu-PBD), for example, can be used as an oxazole derivative. Examples of phenyl-containing compounds and compounds with condensed aromatic substituents are naphthylphenyldiamine (NPD), (4,4'-bis(2,2-diphenylethene-1-yl)diphenyl) (DPVBi), rubrene, (N,N'-bis(naphthalene-1-yl)-N,N'-bis(phenyl)benzidine) (α-NPD), (4,4',4''-tris(N-(naphthalene-1-yl)-N-phenylamino)triphenylamine) (1-TNATA). One can use as carbazole-containing compounds, for example, (4,4'-bis((9-ethyl-3-carbazovinylene)-1,1'-biphenyl) (BCzVBi), as well as smaller carbazole derivatives such as (4,4'-bis(carbazole-9-yl)biphenyl) (CBP). As already mentioned above, these compounds contain electron donor groups such as nitrogen, oxygen or sulfur that are especially suitable for doping with rhenium compounds, for example, rhenium oxo compounds. Further, the rhenium compounds, as Lewis acids, can accept electrons or negative charges or partial charges from the matrix material and thus act as a p-dopant.

According to a further embodiment the dopant and the matrix material form a complex. The doping mechanism is, for example, illustrated in formula 8:

Formula 8

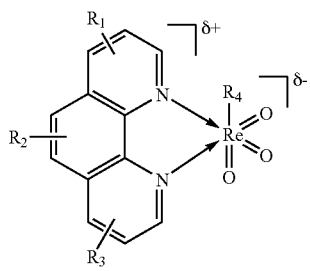

Here the doping activity of the ReO₃ unit is indicated with σ- or π-bonded organic residues. The residues $R_1$, $R_2$ and $R_3$ stand as examples of the substitution pattern at the aromatic substituents. However, more or fewer substituents can also be present. The choice of substituents is not restricted. The ReO₃ unit with σ- or π-bonded organic residues can also form stable complexes that are stabilized with the matrix material via the partial charges δ+ and δ⁻. The complexes of formula 8 are thermally stable up to about 400° C. and therefore are well suited for doping in electrical organic components even if they are operated at high temperatures. The molar ratio of matrix to dopant can vary between 0.001 and 1.

According to a further embodiment the electrically semiconducting layer is a charge transport/charge injection layer, or the electrically semiconducting layer has the function of a charge transport/charge injection layer. The electrically semiconducting layer can transport charges from or to the first and/or second electrode. Further, the charge transport/injection layer can be a hole transport/hole injection layer. In this case positive charges can be transported from the first or second electrode to the organic functional layer under the condition that the first or second electrode is connected as an anode.

According to a further embodiment the component is selected from a group that comprises field effect transistors, solar cells and photodetectors.

Furthermore, the component can comprise a light emitting diode. The doping of the electrically semiconducting layer in a light emitting diode can give rise to increased luminescence, efficiency and lifetime.

According to a further embodiment the organic functional layer of the light emitting diode is a radiation-emitting layer, which can emit radiation in the infrared to ultraviolet range, for example, light in the visible wavelength range (organic light emitting device, OLED). This involves the emission of radiation from the electroluminescent organic functional layer due to the recombination of holes and electrons (electroluminescence) when an electric field is applied to the first and second electrode. In each case, depending on which of the electrodes is designed to be transparent for the emitted radiation, light can be emitted from the device through the first electrode and/or the second electrode.

Furthermore, a method is provided for producing an electrical organic component with the features described above. The method comprises the steps A) providing a substrate, B) generation of an arrangement of functional layers on the substrate, wherein the arrangement of layers comprises a first electrode, an organic functional layer arranged on the first electrode, and a second electrode arranged on the functional layer. The first and/or second electrodes comprise polymeric rhenium compounds. In a further embodiment step B) comprises step B1) generation of the first electrode on the substrate, B2) generation of the organic functional layer on the first electrode, and B3) generation of the second electrode on the organic functional layer.

In addition, in steps B1) and/or B3) monomeric rhenium compounds can be condensed onto the substrate and/or onto the organic functional layer and then heated, so that a polymerization of the rhenium compounds takes place, and the first and/or second electrode is formed. Further, the monomeric rhenium compounds can be selected from the group comprising alkyltrioxorhenium, substituted or unsubstituted cyclopentadienyltrioxorhenium and trioxorhenium with at least one aromatic substituent. The rhenium compounds can further contain dopants, which are selected from a group comprising V, Mo and W. The amount of dopants in the rhenium compounds amounts to less than 20%.

In another embodiment in step B1) and/or step B3) dopants are incorporated into the polymerized rhenium compounds. The dopants can be selected from a group comprising tetrathiafulvalene, bis(ethylenedithio)tetrathiafulvalene and SbF₃. The addition of dopants further improves the charge injection from the electrode into organic functional layers and vice versa and enhances the characteristic conductivity of the electrode.

According to a further embodiment an electrically semiconducting layer is generated on the first electrode and/or on the organic functional layer in a step C) that follows step B1) and/or step B2). In step C) rhenium compounds, as dopants, and a matrix material can be deposited simultaneously on the first electrode and/or on the organic functional layer. A semiconducting layer that contains a dopant and is between the organic functional layer and the first and/or second electrode exhibits an increased conductivity compared to undoped electrically semiconducting layers. Furthermore, in step C) the molar ratio between the rhenium compounds and the matrix material can be adjusted by means of the molar ratio between the deposition rate of the rhenium compound and the deposition rate of the matrix material. In this way the ratio of matrix material to rhenium compound can be varied as desired between 0.001 and 1. Further, in step C) during the generation of the electrically semiconducting layer the molar ratio of matrix material to rhenium compound can be varied so that a gradient arises in the molar ratio of matrix material to rhenium compound within the deposited layer. In this way the conducting properties in the electrically semiconducting layer can be adjusted depending on the thickness of the layer.

According to a further embodiment the semiconducting layer is deposited in a layer thickness of 30 nm in step C). As an alternative to the simultaneous deposition of matrix material and rhenium compounds it is also possible to deposit a layer purely of rhenium compounds first and then the matrix material. The pure rhenium compound layer in this case has a thickness of less than 10 nm. The doping effect of the rhenium compound here acts chiefly at the interface between the first and/or second electrode and the electrically semiconducting layer. At the interface the matrix can partially also deposit into the polymer rhenium compounds of the first and/or second electrode and form an intercalation compound.

According to a further embodiment a further layer with another electrode material can be deposited on the first and/or second electrode. Materials for these additional electrode layers can be selected from a group comprising metals, metal alloys, organic conducting materials and metal oxides.

According to a further embodiment a glass substrate is provided in step A). Furthermore, the first electrode can be an anode. According to a further embodiment the first electrode can be a cathode. If a light emitting diode is used as the organic electrical component, radiation, for example, visible light, can be emitted through the substrate.

BRIEF DESCRIPTION OF THE DRAWINGS

The invention is now to be explained in more detail by means of the FIGURE and the embodiment examples:

The lone FIGURE shows a schematic side view of the electrical organic component.

DETAILED DESCRIPTION OF ILLUSTRATIVE EMBODIMENTS

The FIGURE shows the schematic side view of an embodiment of the electrical organic component in accordance with the invention. On a substrate 1 there is a first electrode 2, on it a first electrically semiconducting layer 3, on top of that an organic functional layer 4 and finally a second electrode 5. The substrate can, for example, be a glass substrate. The first and/or second electrode can comprise polymeric rhenium compounds, for example, rhenium oxo compounds, which are selected from a group comprising polyalkyltrioxorhenium, substituted or unsubstituted poly-cyclopentadienyltrioxorhenium and poly-trioxorhenium with at least one aromatic substituent. For example, the polymeric rhenium oxo compound of the first and/or second electrode is poly-methyltrioxorhenium (Poly-MTO). The polymeric rhenium oxo compounds can contain dopants, which are selected from a group comprising tetrathiafulvalene, bis-ethylenedithio-tetrathiafulvalene, $SbF_3$, V, Mo and W. The first and/or second electrode can further have an additional coating (not shown here), which consists of a material chosen from a group comprising metals and their alloys, noble metals and their alloys, metal oxides and doped polymers. For example, such a coating of the first and/or second electrode can be indium tin oxide (ITO) or aluminum or $AlMg_3$. The first electrically semiconducting layer 3 comprises a matrix material and a dopant. The matrix material can comprise organic materials that have electron donor functions and can be selected from the group comprising phenanthroline derivatives, imidazole derivatives, triazole derivatives, oxadiazole derivatives, phenyl-containing compounds, compounds with condensed aromatic substituents, carbazole-containing compounds, fluorene derivatives, spirofluorene derivatives and pyridine-containing compounds as well as any combinations of the materials. Examples of such matrix materials are Bphen, BCP, TPBi, TAZ, Bu-PBD, DPVBi, rubrene, α-NPD (NPB), 1-TNATA, CBP, BCzVBi, wherein rubrene and BCzVBi can also be used as emitting materials. The dopant comprises rhenium compounds, which can be rhenium oxides, organometallic derivatives or rhenium oxides and rhenium oxyhalides and mixtures thereof. Furthermore, the dopants can comprise an $ReO_3$ unit, to which a residue M is bound, which can be organic. Residue M can be σ-bonded to the $ReO_3$ unit. In this case residue M comprises saturated aliphatic groups, unsaturated aliphatic groups, aromatic substituents, anions of carboxylic acids, halogens, stanyl residues and silyl residues. The aliphatic groups, aromatic substituents and anions of carboxylic acids may additionally have substituents. Residue M can be π-bonded to the $ReO_3$ unit. In this case residue M can comprise unsubstituted or substituted cyclopentadienyl $(C_5R_xH_{5-x})$, where x is 1 to 5 and R, independent of one another, can be a methyl, ethyl or phenyl residue. The dopant and the matrix material form a complex. It is characterized by particular temperature stability up to 400° C., ease of sublimation and easy processability. The molar ratio of matrix material to dopant in each case according to need can be varied between 0.001 and 1. In addition, within the electrically semiconducting layer 3 the molar ratio of matrix to dopant can be varied so that a gradient arises. The electrically semiconducting layer 3 can comprise a charge transport/charge injection layer, for example, a hole transport/hole injection layer. Furthermore, the first electrode 2 can be connected as an anode. The organic functional layer 4 can comprise a light-emitting layer. The electrical organic component shown in FIG. 1 can be an organic light emitting diode (OLED). Further, it can be a field effect transistor, a solar cell or photodetector. If it is a field effect transistor, there is a source electrode, a gate electrode and a drain electrode present (not shown here), where the source and drain electrodes are doped and an undoped or doped semiconductor lies between them.

The introduction of rhenium compounds, for example, rhenium oxo compounds, as p-dopants in the electrically semiconductor layer 3 leads to improved conductivities of the electrically semiconducting layer and to a stable p-doping, which increases the efficiency and lifetime of the component and makes it possible for the material of the first and/or second electrode to be selected independently.

The use of polymer rhenium compounds, for example, rhenium oxo compounds, in the first and/or second electrode additionally leads to improved conductivities and charge injections from the electrodes into the electrically semiconducting layer or into the organic functional layer and vice versa, which leads to improved efficiency and lifetime of the component.

Example 1

A chillable and heatable substrate plate (−30 to −50° C. to a maximum of 200° C.) is mounted in a high vacuum container (base pressure <$10^{-5}$ mbar). MTO is introduced through an inlet preheated to about 60° C. Alternatively, MTO can also be introduced via an inert carrier gas. MTO is condensed onto a glass or quartz disk or a plastic film situated on the substrate plate, which is chilled to −30° C. After a layer thickness of about 150 nm MTO was achieved, the container was brought to a pressure of about 10-900 mbar with dry inert gas. Then the semihard solid is slowly heated at 0.1-20 K/min beyond the melting point of 108-250° C. As this happens polymerization takes place, with elimination of hydrocarbons (mainly methane). It is also possible to condense in additional substances, for example, TTF, BEDT-TTF and $SbF_3$ for doping the electrode. After having finished the polymerization the deposition of the electrode is complete. It can optionally be further consolidated by an afterheating step at 140-250° C. The described process is suitable for depositing the first electrode on the substrate, and further it is possible with the described process to deposit the second electrode after having applied the remaining layers. In the case of the production of light emitting diodes, both a top-emitting light emitting diode and also a bottom-emitting light emitting diode can be produced in this way.

Example 2

In a further example the substrate plate with clamped glass plate is chilled to −10° C. in a high vacuum container (base pressure <$10^{-7}$ mbar). MTO is introduced via an inlet preheated to about 60° C. MTO is condensed on the glass disk until a layer thickness of 150 nm MTO is obtained. Then the container is brought to a pressure of about 250 mbar with dry argon. Then the semihard solid is slowly heated at 3 K/min beyond the melting point of 106-110° C., whereupon the polymerization to poly-MTO takes place with elimination of methane. After having finished the polymerization the deposition of the electrode is complete. This substrate is removed from the vacuum container and photolithographically structured. In the vacuum container there is also a source with an electrically heatable container with a cover which is filled with NPB. Then the glass disk with the structured poly-MTO electrodes is affixed to the substrate holder at a distance of about 25 cm from the NPB source. The NPB and MTO are deposited on the electrode at the same time. A total layer thickness of 30 nm electrically semiconducting layer is deposited. Then another 10 nm pure NPB is deposited as electron blocking layer. After this other layers of the electrical component can be deposited. In this example the dopant concentration in the electrically semiconducting layer is 50%. Furthermore, the dopant concentration can be 1%. Bphen, TAZ or naphthalenetetracarboxylic anhydride can also be used as matrix material. Instead of the MTO it is also possible to use cyclopentadienyltrioxorhenium or pentamethylcyclopentadienyltrioxorhenium. A molar ratio dopant layer of 10:1 up to 10,000:1 can be generated in the electrically semiconductor layer. After the polymerization of the electrode material a solidification step can be carried out at 130° C. A top-emitting light emitting diode or a bottom-emitting light emitting diode can be produced by this process.

The example shown in the lone FIGURE and the embodiment examples can be varied as desired in production. In addition attention should be called to the fact that the invention is not limited to these examples, but rather allows for other embodiments that are not shown here.

The invention claimed is:

1. An electrical organic component comprising:
    a first electrode;
    an organic functional layer disposed on the first electrode; and
    a second electrode disposed on the organic functional layer,
    wherein the first electrode comprises polymeric rhenium compounds and is transparent and/or wherein the second electrode comprises polymeric rhenium compounds and is transparent.

2. The component according to claim 1, wherein the first and/or second electrode consists of polymeric rhenium compounds.

3. The component according to claim 1, wherein the polymeric rhenium compounds comprise organometallic rhenium oxides.

4. The component according to claim 3, wherein the polymeric rhenium compounds comprise a material selected from the group consisting of polyalkyltrioxorhenium, substituted or unsubstituted polycyclopentadienyltrioxorhenium and polytrioxorhenium with at least one aromatic substituent.

5. The component according to claim 1, wherein the polymeric rhenium compound comprises polymethyltrioxorhenium.

6. The component according to claim 1, wherein the polymeric rhenium compounds comprise dopants.

7. The component according to claim 6, wherein the dopants comprise dopants selected from the group consisting of tetrathiafulvalene, bis(ethylenedithio)tetrathiafulvalene, $SbF_3$, V, Mo and W.

8. The component according to claim 1, further comprising a doped electrically semiconducting layer between the organic functional layer and the first or the second electrode.

9. The component according to claim 8, wherein the doped electrically semiconducting layer comprises a dopant that comprises rhenium compounds.

10. The component according to claim 9, wherein the dopant consists of an $ReO_3$ unit to which a residue M is bonded.

11. The component according to claim 1, wherein the component is a field effect transistor, solar cell or photodetector.

12. The component according to claim 1, wherein the component comprises a light emitting diode.

13. The component according to claim 12, wherein the organic functional layer comprises a radiation-emitting layer.

14. A method for producing an electrical organic component, the method comprising:
    forming an arrangement of functional layers on a substrate, wherein the arrangement of functional layers comprises a first electrode, an organic functional layer arranged on the first electrode and a second electrode arranged on the organic functional layer, wherein the first electrode comprises polymeric rhenium compounds and is transparent and/or wherein the second electrode comprises polymeric rhenium compounds and is transparent.

15. The method according to claim 14, wherein forming the arrangement of functional layers comprises:
    forming the first electrode on the substrate;
    forming the organic functional layer on the first electrode; and forming the second electrode on the organic functional layer.

16. The method according to claim 15, wherein forming the first and/or second electrode comprises
condensing monomeric rhenium compounds onto the substrate and/or onto the organic functional layer; and
then heating the condensed monomeric rhenium compounds thereby polymerizing the rhenium compounds.

17. The method according to claim 16, wherein the monomeric rhenium compounds comprise compounds selected from the group consisting of alkyltrioxorhenium, substituted or unsubstituted cyclopentadienyltrioxorhenium and trioxorhenium with at least one aromatic substituent.

18. The method according to claim 17, wherein the rhenium compounds comprise dopants that are selected from the group comprising V, Mo and W.

19. The method according to claim 16, wherein forming the first electrode and/or forming the second electrode comprises forming an electrode comprising the polymerized rhenium compounds and dopants.

20. The method according to claim 19, wherein the dopants comprise dopants selected from the group consisting of tetrathiafulvalene, bis(ethylenedithio)tetrathiafulvalene and $SbF_3$.

21. The method according to claim 15, further comprising forming an electrically semiconducting layer on the first electrode and/or on the organic functional layer.

22. The method according to claim 21, wherein forming the electrically semiconducting layer comprises depositing rhenium compounds, as dopants, and a matrix material simultaneously on the first electrode and/or on the organic functional layer.

23. The method according to claim 22, wherein in forming the electrically semiconducting layer a molar ratio between the rhenium compounds and the matrix material is established by using a ratio between a deposition rate of the rhenium compounds and a deposition rate of the matrix material.

24. The method according to claim 21, wherein the electrically semiconducting layer is deposited in a layer thickness of 30 nm.

25. The method according to claim 14, wherein providing the substrate comprises providing a glass substrate.

26. The method according to claim 14, wherein the first electrode is an anode.

27. The method according to claim 14, wherein the first electrode is a cathode.

28. An electrical organic component comprising:
a first electrode
an organic functional layer disposed on the first electrode; and
a second electrode disposed on the organic functional layer,
wherein the first electrode comprises polymeric rhenium compounds and is transparent or wherein the second electrode comprises polymeric rhenium compounds and is transparent, and
wherein the polymeric rhenium compounds comprise a material selected from the group consisting of substituted or unsubstituted polycyclopentadienyltrioxorhenium and polytrioxorhenium with at least one aromatic substituent.

29. The electrical organic component according to claim 28, wherein the polymeric rhenium compounds is cyclopentadienyltrioxorhenium or pentamethylcyclopentadienyltrioxorhenium.

* * * * *